Feb. 27, 1968 R. A. ROQUES ETAL 3,371,148

SEMICONDUCTOR DEVICE PACKAGE AND METHOD OF ASSEMBLY THEREFOR

Filed April 12, 1966

INVENTORS
RODNEY A. ROQUES,
EUGENE B. STEWART
& URYON S. DAVIDSOHN

BY Hurvitz & Rose
ATTORNEYS

United States Patent Office 3,371,148
Patented Feb. 27, 1968

3,371,148
SEMICONDUCTOR DEVICE PACKAGE AND METHOD OF ASSEMBLY THEREFOR

Rodney A. Roques, Palm Bay, and Eugene B. Stewart, West Melbourne, Fla., and Uryon S. Davidsohn, Tempe, Ariz., assignors to Radiation Incorporated, Melbourne, Fla., a corporation of Florida
Filed Apr. 12, 1966, Ser. No. 542,024
23 Claims. (Cl. 174—52)

ABSTRACT OF THE DISCLOSURE

An integrated circuit package and fabrication method therefor in which an insulative substrate has a plurality of terminal strips bonded along a surface thereof, the terminal strips comprising a layer of semi-conductor material bonded to said surface and a eutectic alloy of a metal and said semi-conductor material bonded to and superposed on said layer. A semi-conductor circuit chip is bonded to said alloy, the alloy providing electrical connections to the chip. The method of fabricating the package comprises the sequential deposition of the semi-conductor and metal in layers on the substrate, etching the layers to correspond to a layout determined by interconnection requirements of the integrated circuit chip, and mating metal contact pads of the circuit chip with corresponding portions of the terminal strips. The chip and substrate are then heated to form a eutectic alloy including all of the metal in the terminal strips.

The present invention relates to the art of packaging semiconductor devices and more particularly, to an improved method and structure for providing electrical and mechanical bonding of a semiconductor integrated-circuit to a supporting substrate.

An integrated-circuit component, sometimes referred to as a "monolithic circuit" or a "solid state circuit," may be the functional equivalent of a plurality of discrete electrical components of either the passive or active type. That is, a single integrated circuit may be the equivalent of discrete resistors, capacitors, and transistors of the conventional type, connected into a circuit arrangement such as an amplifier, oscillator, switch, or any of a number of logic elements or gates.

Because of their extremely small size and light weight, integrated-circuits have found wide use in both commercial and military electronic devices. The extremely small size, although a principal advantage in their use, creates a number of problems in the fabrication of these devices. For example, the connection of leads to the various terminals of each functionally discrete component of the integated-circuit poses a severe problem, since the diameters of the leads are relatively large with respect to the distances between component points in the integrated-circuit. Furthermore, there is a relatively high probability that these leads will short against each other or contact the semiconductor surface of the integrated circuit during fabrication or during operation in such a manner as to modify its operation or render it totally inoperative. In order to interconnect various integrated-circuits to form a particular system or to connect the integrated circuit to a source of power, a source of signal, or any other external source, it is required that external leads be attached to various circuit points in the integrated circuit. The aforementioned problems are encountered also in the attachment of these external leads.

Integrated-circuits may generally be formed by several methods. One type of integrated-circuit may be formed by utilizing a chip of semiconductor material, such as silicon, and locating each discrete component within various regions of the chip. The chip may be provided with other semiconductor layers, in addition to various insulating layers, and particular regions thereof may be doped to provide different electrical conductivities. In this manner, certain regions of the structure may be utilized as discrete resistances, having the intrinsic resistance value of the semiconductor or insulator material, while certain other regions may provide a plurality of PN junctions to function as diodes, transistors, and capacitors.

Since the size of the semiconductor chip is generally only on the order of 0.1 inch square (one tenth), having a depth of about 0.02 inch, the terminal portions of the circuits are generally far smaller than the diameters of conventional lead wires. Therefore, specially fine lead wires are used which must be capable of making good ohmic contact and strong mechanical bonds to the integrated circuit. These wires are both difficult to handle and difficult to properly connect in the manufacture of the final product, thus this construction tends to reduce the reliability thereof.

Further, due to the relatively brittle nature of the semiconductor chip, an adequate housing and support is required to prevent mechanical shocks from injuring the device. Also, the electrical properties and characteristics of semiconductor chip integrated-circuits are generally effected by changes in their ambient conditions. Therefore, the circuit must have a housing which not only renders the device insensitive to mechanical shocks, but provides protection from dust particles and moisture.

The present invention particularly relates to an integrated-circuit package made by a method which obviates, to a great extent, the problems inherent in the prior methods of integrated circuit fabrication. The package, in accordance with the present invention, is made by cleaning a thin ceramic substrate with an etchant and depositing thereon, a layer of semiconductor material of the same general type as that of the integrated circuit chip. A metal layer is then deposited over the semiconductor layer and both the metal and semiconductor layers are etched to correspond to the predetermined layout pattern of an integrated circuit component. Thus, the resulting structure is formed by the ceramic substrate having raised conductive regions comprising semiconductor material with metal disposed thereover. These regions are arranged in such a manner that electrical connections are made to the proper terminal pads of the integrated-circuit chip with portions of the conductive regions constituting the leads of the device. The semiconductor chip is then inverted and oriented such that the circuit contact pads, or terminals, will mate with the corresponding points on the pattern of conductive regions. Heat is then applied to bond the chip to the substrate, which also simultaneously forms all necessary electrical connections.

External leads may then be attached to the conductive regions and the circuits electrically tested and "burned in" prior to commitment to the final package, which might be formed by encapsulation of the entire structure.

The deposition of the semiconductor material directly on the alumina substrate prior to the evaporation of the metal leads is particularly significant in the formation of a metal-semiconductor eutectic alloy connection between the semiconductor integrated-circuit wafer and the insulating substrate. The formation of such an alloy with close matching thermal expansion and thermal conductivity properties of the metalization and substrate materials assures overall integrity and reliability. That is, the method in accordance with the present invention yields a lower number of rejects and higher probabilities of reliable device operation since the metallurgical bonds are both mechanically strong and have good ohmic characteristics. Thus, not only is a device produced which has improved electrical characteristics, but such a device is produced in a manner affecting greater cost economies and a total effective increase in electrical reliability.

It is, therefore, an object of the present invention to provide an improved method of fabricating integrated circuit devices than heretofore known.

Another object of the present invention is the fabrication of an integrated circuit having greater reliability than those presently available.

Still another object of the present invention is to provide a method of fabricating an integrated circuit device wherein the circuit may be tested prior to the final packaging.

Still a further object of the present invention is to provide versatility in package design and in encapsulation of integrated circuits.

It is a further object of the present invention to provide an economical and reliable integrated-circuit package and a method for the fabrication thereof wherein a semiconductor integrated-circuit chip is bonded to a metalized insulating substrate having a layer of semiconductor material disposed between said metalization and said substrate.

The above and still further objects, features and advantages of the present invention will become apparent upon consideration of the following detailed description of one specific embodiment thereof, especially when taken in conjunction with the accompanying drawings, wherein.

Figure 1:
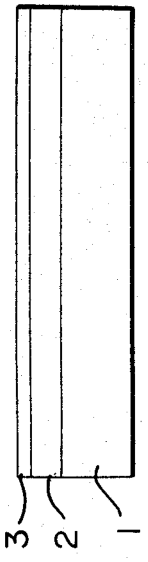
FIGURES 1–3 are diagrams of the cross-section of the structure during three stages of fabrication in accordance with the present invention.
Figure 2:
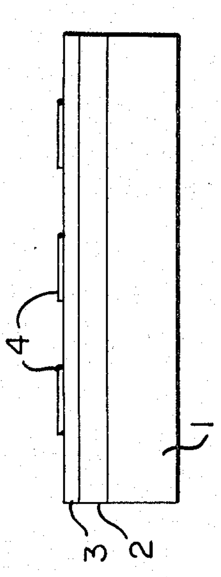
Figure 3:
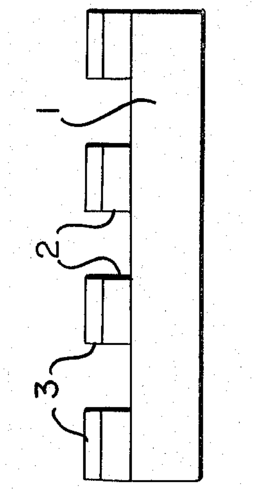

Referring now to FIGURES 1 through 3, a thin ceramic substrate 1 of about 0.010 inch thickness and preferably of a high alumina composition, is cleaned by etching with a diluted nitric acid solution. Pyrolytic silicon is then deposited on one surface of the ceramic substrate forming the semiconductor layer 2, as shown in FIGURE 1. The deposition of the silicon may be performed by the hydrogen reduction of a silicon halide, for example, according to techniques well known in the semiconductor materials art. The deposition is continued until the thickness of the silicon layer 2 is approximately 0.001 inch.

A metal layer 3 is then deposited over the silicon layer 2, by evaporation, to a thickness ranging from 30 to 60 microinches. The metal may be gold of a commercial grade, or an alloy thereof. Also, other conductive materials and metals, such as aluminum, may be substituted for the gold in accordance with the compatibility thereof with the materials used in the contact terminals, or pads, of the integrated circuit chip.

Although other materials may be used for the semiconductor layer 2 and the metal layer 3, the combination of gold on silicon is preferred. Other materials that may be used for the semiconductor layer 2 are germanium, the semiconductor intermetallic compounds formed by the elements in groups III and V of the periodic table such as gallium arsenide and indium antimonide, and such other semiconductor materials having general utility in electronic semiconductor devices.

Using a conventional photo-resist technique, a layer of photo-sensitive polymerizable material is disposed on the exposed surface of the gold layer 3. A mask, having the desired pattern, corresponding to the mirror image of the layout of the integrated circuit chip 5 is placed over the photosensitive polymerizable material. The assembly is then exposed to light or other suitable radiation for a period of time sufficient to polymerize the exposed areas. The mask is then removed and the surface is etched with any of the commonly used etching solutions. Two solutions are used, one for etching the gold layer 3 and the other for etching the silicon layer 2. The two particular solutions used were Techni Strip and 39E Etchant, which are known trademarks generally available commercially. Other etching solutions might be used so long as they will etch the appropriate material layer or layers. The selection of an etchant is within the ordinary skill of the art and does not form any part of the present invention.

The polymerized photo-resist material 4 is then removed, which results in the structure illustrated in FIGURE 3. As shown, the silicon and gold layers have been etched away in part, exposing the substrate 1 of alumina. The raised portions that remain form the substrate conductive pattern which is designed to mate, or register, with the terminal layout of the integrated-circuit chip 5.

Figure 4:
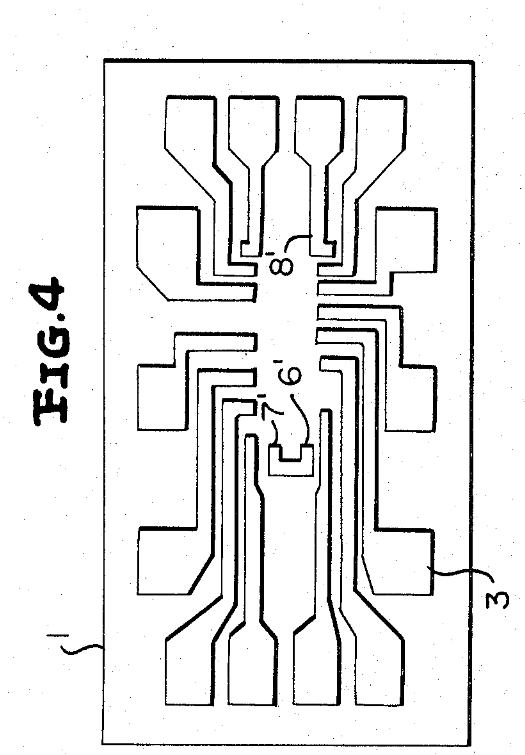
FIGURE 4 is a diagram of the top view of the substrate showing a conductive pattern in accordance with the present invention.
Figure 5:
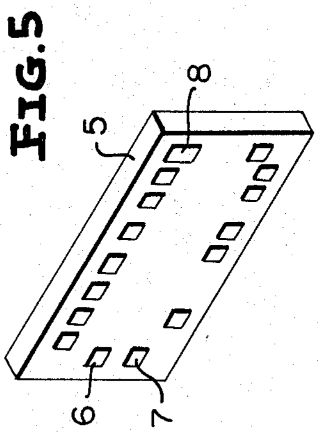
FIGURE 5 is a schematic representation of a semiconductor integrated-circuit chip that is to be packaged in accordance with the present invention.

FIGURE 4 illustrates a substrate conductive pattern made in accordance with the present invention and adapted to mate with the integrated-circuit chip 5 shown in FIGURE 5. The integrated-circuit chip generally comprises a substrate of silicon semiconductor material 5 having various regions thereof adapted to function as discrete electronic components as previously discussed. The pads of which 6, 7 and 8 are exemplary, are arranged about the perimeter of the silicon chip 5 on one face thereof and form terminals for the electrical connections to the various functional regions of the integrated-circuit. The metal interconnections and pads evaporated on the monolithic silicon integrated-circuit must be suitable for forming a metalurgical bond to the substrate metalization. Gold evaporated over a refractory metal such as chromium, molybdenum, tantalum, and the like, have been used for making the necessary ohmic contacts to the silicon, although other combinations of metals might be used. The combination of gold evaporated over molybdenum is preferred, the molybdenum having a coefficient of expansion which closely matches that of silicon, and the gold providing the required alloy joining compatability in accordance with the method of the present invention.

It has also been found that aluminum can be used in place of gold; however, the aluminum-silicon alloy formation is more critical due to the high eutectic alloying temperature of 577° C. required. In addition, there is the possibility of "over-alloying" the ohmic contact areas on the circuit chip during the bonding step, which step is not as critical when forming the gold-silicon alloy.

In the assembly of the integrated-circuit package, the silicon chip 5 is inverted and oriented such that the circuit pads will register with the corresponding conductor leads of the substrate conductive pattern. Thus, for example, the silicon chip shown in FIGURE 5 is inverted and placed on the substrate conductive pattern shown in FIGURE 4 such that terminal pads 6, 7 and 8 are in registration and in electrical metal-to-metal contact with the conductor leads at 6′, 7′ and 8′, respectively. Registration is accomplished by a simple mechanical alignment technique using a transparent template to position the chips on the substrate. Alternatively, registration may be provided by automatic alignment apparatus and jigs, or by the use of alignment notch techniques.

The substrate and circuit chip combination is then placed in a heated environment, such as an oven, or alternatively may be subjected to localized heating applied to both the now exposed face of the chip and to the substrate, which affects a metalurgical bond between the terminal pads and the corresponding conductor portions of the substrate conductive pattern. Sufficient heat is supplied to cause the alloying action of the metals, resulting in a gold-silicon eutectic having a melting point of 377° C. which alloys with the gold-molybdenum evaporated contacts of the monolithic integrated-circuit chip.

A mechanical and electrical joint is thus produced between the silicon circuit chip and the substrate which is superior to that heretofore achieved. The gold of the chip terminal pads alloys to the gold and silicon on the substrate, producing a joint having greater strength and electrical and mechanical reliability than would be produced when the gold of the chip is bonded to a gold lead. The resulting decrease in the number of rejects thus yields manufacturnig cost economies.

The circuit chip mounted on the ceramic substrate may then be electrically tested since the leads of the substrate conductive pattern may terminate in portions of somewhat increased area, as indicated by 3 in FIGURE 4, to form terminals for access to the various regions of the integrated circuit chip 5.

The structure may also be heat treated, or "burned-in," at this time to further increase the reliability.

Figure 6:
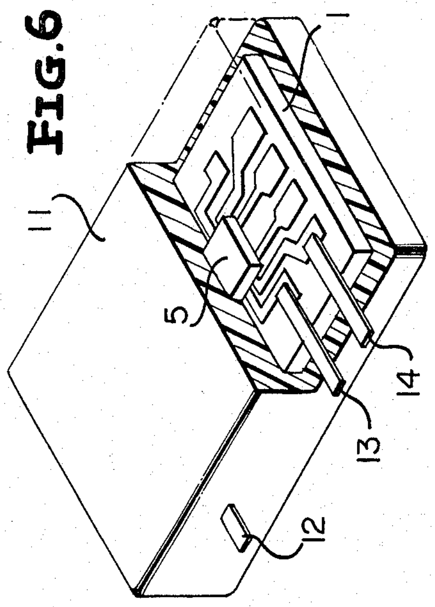
FIGURE 6 is a diagram of the integrated circuit package in its final form having a portion of the housing cut away to expose the device and supporting structure in accordance with the present invention.

External leads such as 12, 13 and 14 shown in FIGURE 6 may then be attached to the substrate by any one of several methods. Specifically, lead ribbons or wires may be eutictic soldered to the substrate pads 3 using, for example, a gold-tin alloy composition having 80% gold and 20% tin with a melting point of 280° C.

The integrated circuit mounted on the ceramic substrate and having external leads affixed thereto may then be encapsulated in an epoxy resin 11 to provide an economical package as shown in the cutaway view of FIGURE 6.

While we have described and illustrated one specific embodiment of our invention, it will be clear that variations of the details of construction which are specifically illustrated and described may be resorted to without departing from the true spirit and scope of the invention as defined in the appended claims.

We claim:

1. The method of fabricating an integrated-circuit package comprising the steps of depositing a layer of semiconductor material directly on an insulative substrate;

depositing a layer of metal directly on said layer of semiconductor material;

etching said conductor material and said semiconductor material such that the materials remaining on said substrate form a predetermined electrically conductive pattern of terminal strips;

placing an inverted monolithic integrated-circuit semiconductor chip having terminal pads of said metal located thereon according to said predetermined pattern on said substrate with said terminal pads in contact with portions of said terminal strips; and heating said semi-conductor chip and said substrate structure to form a eutectic alloy comprising only a portion of said semiconductor material and the metal from said layer of metal and from said terminal pad to join said chip to said substrate, whereby strong mechanical bonding and electrical ohmic connections are formed between said terminal strips and said monolithic integrated-circuit semiconductor chip.

2. The method according to claim 1 wherein said semiconductor material is silicon.

3. The method according to claim 1 wherein said metal is gold.

4. The method according to claim 1 wherein said substrate comprises an alumina composition.

5. The method according to claim 4 further comprising the step of encapsulating the entire structure in an epoxy resin.

6. The method according to claim 4 wherein said semiconductor material is silicon and wherein the step of depositing the silicon includes the hydrogen reduction of a silicon halide.

7. The method according to claim 6 wherein said metal is aluminum.

8. The method according to claim 6 wherein said metal is gold and wherein the silicon layer is deposited to a thickness of approximately .001 inch, and the gold layer is deposited to a thickness of between 30 and 60 microinches.

9. The method according to claim 1 further comprising the step of bonding external leads to said terminal strips.

10. The method according to claim 1 wherein said metal is aluminum.

11. The method according to claim 1 wherein the thickness of said semiconductor layer is sufficiently great that more semiconductor material is provided therein than is required to form the eutectic alloy with the metal from the layer of metal and from the terminal pads.

12. An integrated circuit package comprising:

an insulative substrate;

a plurality of electrically conductive terminal strips bonded along a surface of said substrate, said terminal strips each comprising a layer of semiconductive material bonded to said substrate and a eutectic alloy of said semiconductor material and a metal superposed on and integral with said layer of semiconductor material;

a monolithic integrated-circuit chip having electrodes integral with and superposed on said eutectic alloy, at least some of said terminal strips extending beyond the confines of said monolithic integrated circuit chip.

13. The integrated circuit package according to claim 12 wherein said semiconductor material is silicon.

14. The integrated circuit package according to claim 12 wherein said metal is gold.

15. The integrated circuit package according to claim 12 wherein said substrate comprises an alumina composition.

16. The integrated circuit package according to claim 15 wherein said semiconductor material is silicon.

17. The integrated circuit package according to claim 16 wherein said metal is gold.

18. The integrated circuit package according to claim 16 wherein said metal is aluminum.

19. The integrated circuit package according to claim 12 further comprising external leads bonded to respective ones of said terminal strips.

20. The integrated circuit package according to claim 19 further comprising an epoxy resin encapsulating the entire structure.

21. The integrated circuit package according to claim 15 wherein said metal is aluminum.

22. An integrated circuit package comprising:

a monolithic integrated-circuit chip having pads;

an insulative substrate;

a layer of semiconductor material bonded to said substrate;

a eutectic alloy of a metal and said semiconductor material superposed on and integral with said layer of semiconductor material;

said monolithic integrated-circuit pads having a eutectic bond with and being superposed on said eutectic alloy.

23. The integrated circuit package according to claim 22 and further comprising electrical terminal means extending from said eutectic alloy along said layer of semiconductor material and beyond the confines of said monolithic integrated-circuit chip, whereby said eutectic alloy provides electrical connections between said terminal means and said monolithic integrated-circuit chip.

References Cited

UNITED STATES PATENTS 3,292,241 12/1966 Carroll ------------ 317—234

DARRELL L. CLAY, *Primary Examiner.*